US005525586A

United States Patent [19]
Singh et al.

[11] Patent Number: 5,525,586
[45] Date of Patent: Jun. 11, 1996

[54] METHOD OF PRODUCING IMPROVED MICROSTRUCTURE AND PROPERTIES FOR CERAMIC SUPERCONDUCTORS

[75] Inventors: Jitendra P. Singh, Naperville; Rob A. Guttschow, Bloomington; Joseph T. Dusek, Lombard; Roger B. Poeppel, Glen Ellyn, all of Ill.

[73] Assignee: The University of Chicago, Chicago, Ill.

[21] Appl. No.: 306,927

[22] Filed: Sep. 15, 1994

Related U.S. Application Data

[63] Continuation of Ser. No. 947,668, Sep. 18, 1992, abandoned.
[51] Int. Cl.$^6$ ................................................ H01L 39/12
[52] U.S. Cl. ........................ 505/490; 264/65; 505/500
[58] Field of Search ................................ 505/490, 500; 264/65

[56] References Cited

U.S. PATENT DOCUMENTS

| | | | |
|---|---|---|---|
| 4,883,922 | 11/1989 | Yokota et al. | 174/125.1 |
| 5,089,465 | 2/1992 | Sibata et al. | 505/1 |
| 5,145,829 | 9/1992 | Asano et al. | 505/1 |
| 5,166,130 | 11/1992 | Enomoto et al. | 505/780 |
| 5,232,907 | 8/1993 | Matsuhiro et al. | 505/1 |
| 5,272,132 | 12/1993 | Gyorgy et al. | 505/1 |
| 5,354,733 | 10/1994 | Kinoshita et al. | 505/125 |

OTHER PUBLICATIONS

Patent Abstracts of Japan 02-135617, Aug. 10, 1990, vol. 14, No. 371.

*Primary Examiner*—Christopher A. Fiorilla
*Attorney, Agent, or Firm*—Reinhart, Boerner, Van Deuren, Norris & Rieselbach

[57] ABSTRACT

A ceramic superconductor is produced by close control of oxygen partial pressure during sintering of the material. The resulting microstructure of $YBa_2Cu_3O_x$ indicates that sintering kinetics are enhanced at reduced $p(O_2)$. The density of specimens sintered at 910° C. increased from 79 to 94% theoretical when $p(O_2)$ was decreased from 0.1 to 0.0001 MPa. The increase in density with decrease in $p(O_2)$ derives from enhanced sintering kinetics, due to increased defect concentration and decreased activation energy of the rate-controlling species undergoing diffusion. Sintering at 910° C. resulted in a fine-grain microstructure, with an average grain size of approximately 4 μm. Such a microstructure results in reduced microcracking, strengths as high as 191 MPa and high critical current density capacity.

12 Claims, 13 Drawing Sheets

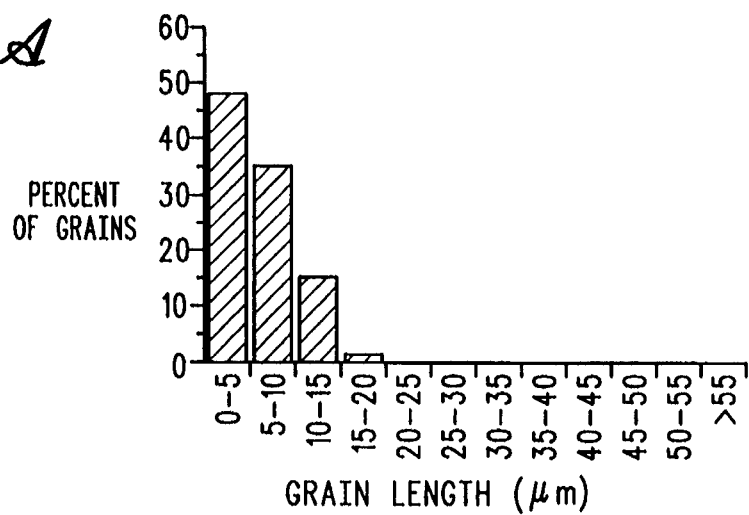
Fig. 2A
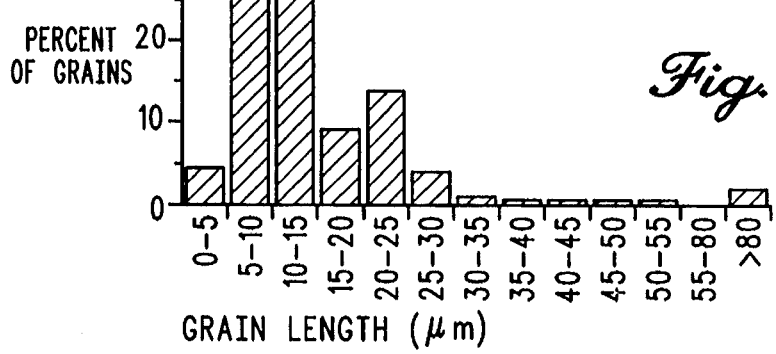
Fig. 2B
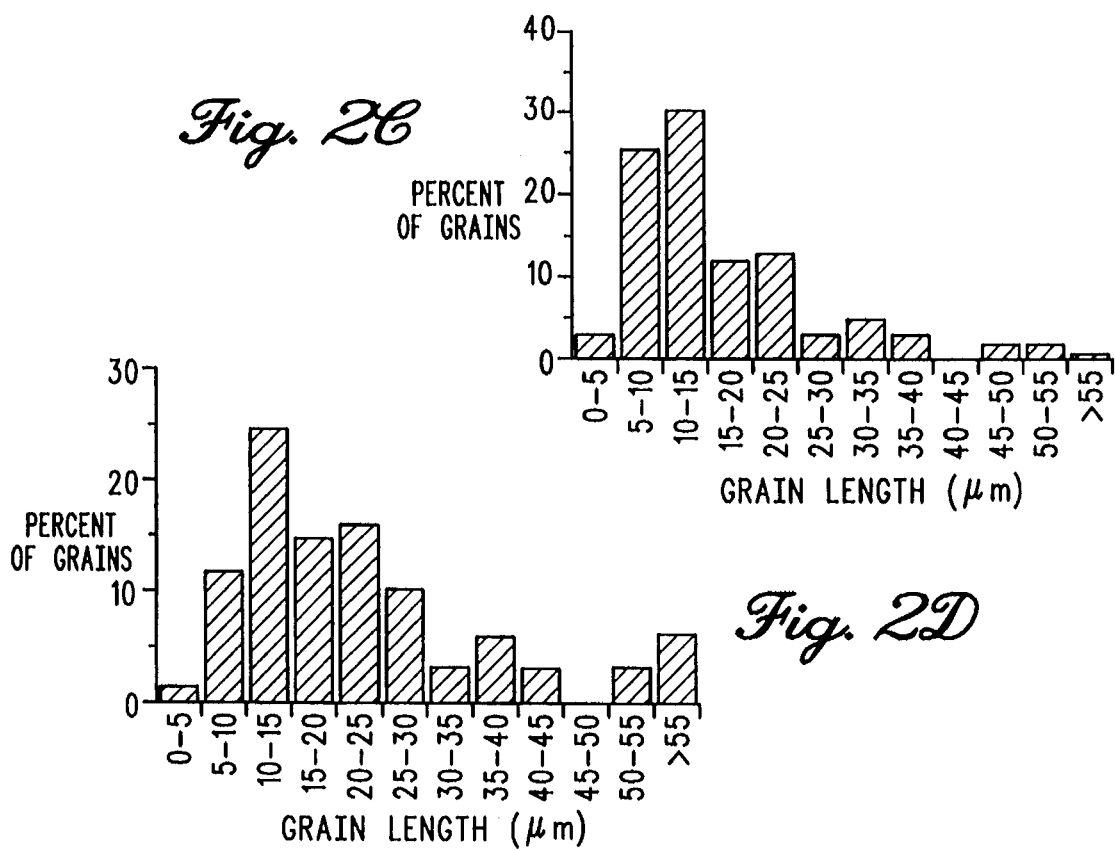
Fig. 2C
Fig. 2D

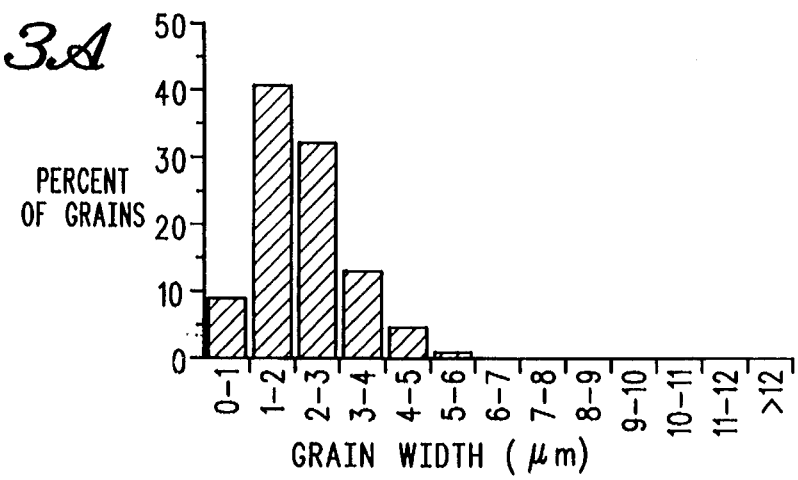
Fig. 3A
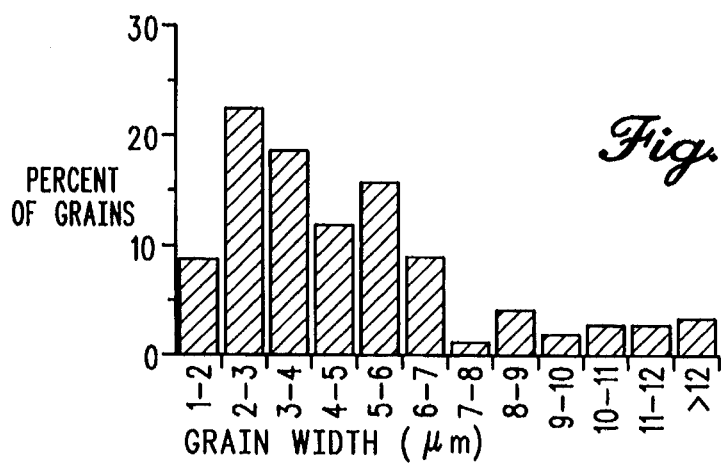
Fig. 3B
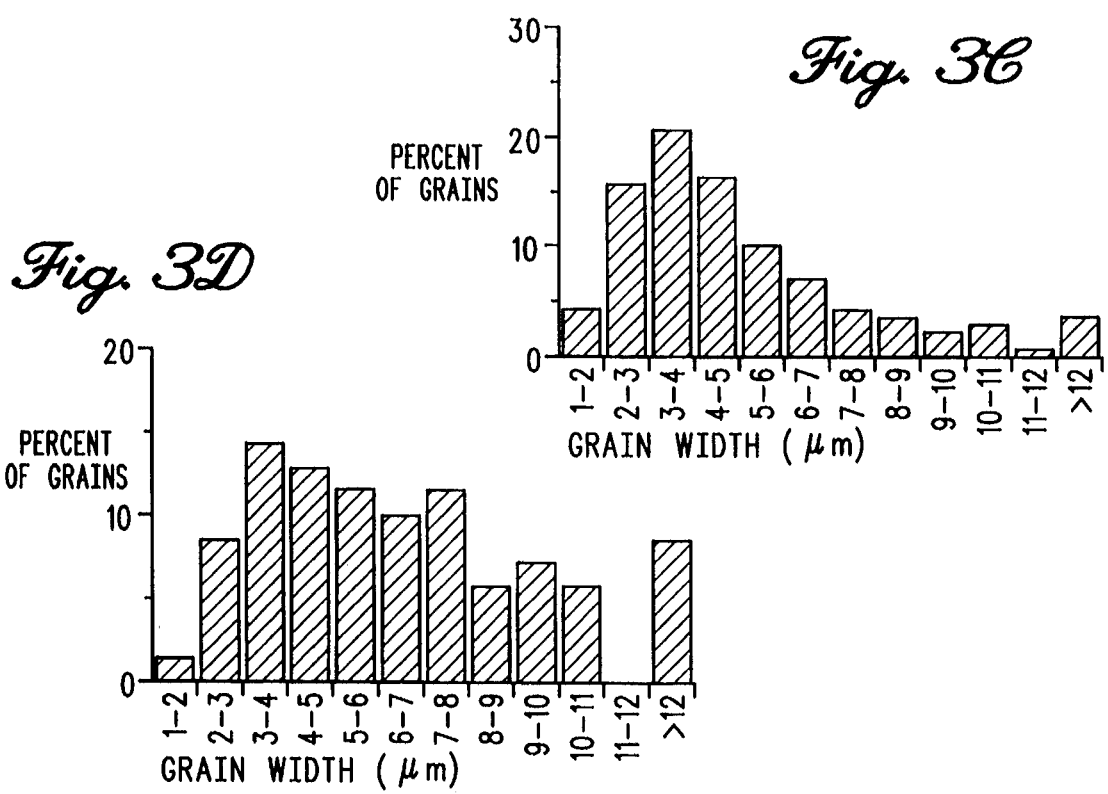
Fig. 3C
Fig. 3D

METHOD OF PRODUCING IMPROVED MICROSTRUCTURE AND PROPERTIES FOR CERAMIC SUPERCONDUCTORS

The U.S. Government has certain rights in this invention pursuant to Contract No. W-31-109-Eng-38 of the Department of Energy.

This is a continuation of application(s) Ser. No. 07/947,668 filed on Sep. 18, 1992, now abandoned.

The present invention is concerned generally with a method of manufacture and a product ceramic superconductor. More particularly, the invention is concerned with a method of controlling oxygen gas pressure and temperature variables to dictate the microstructural makeup of ceramic superconductors, such as $YBa_2Cu_3O_x$ and the like, and in turn to obtain a high critical current capacity and high strength superconductor.

Ceramic superconductors constitute an important group of materials having substantial potential applications arising from their very high superconducting critical temperature. $YBa_2Cu_3O_x$ (YBCO) is one of the most widely studied and potentially useful high-temperature superconductors. For these ceramic materials to be useful in commercial applications, they must however possess good superconducting and mechanical properties. However, the mechanical strength of such ceramics as YBCO processed by conventional methods is generally unacceptably low. The low strength values have been attributed to the fact that the density of bulk YBCO specimens sintered in a 100% oxygen atmosphere is generally low (less than 80–90% theoretical). Sintering at temperatures above about 950° C. results in higher densities, but gives rise to degradation in critical current density ($J_c$), partly due to the presence of second phases. Furthermore, sintering at higher temperatures also results in grain growth and accompanying microcracking. Such microcracking results in reduced strength and will also act as weak links and substantially degrade the $J_c$.

Improvement in density, as well as mechanical and superconducting properties, has been achieved recently by making composites of YBCO with silver additions. Another approach to improving density and mechanical properties has been the fabrication of monolithic YBCO through the control of processing parameters, such as powder particle size and heat treatment. Sintering at lower $p(O_2)$ has the potential for producing specimens with relatively small grains. However, it has been observed that YBCO becomes unstable at very low $p(O_2)$ and can precipitate undesirable phases, with a consequent degradation in $J_c$.

It is therefore one object of the invention to provide an improved method of manufacturing high temperature ceramic superconductors.

It is another object of the invention to provide a novel method of making high temperature ceramic superconductors using well controlled sintering techniques.

It is a further object of the invention to provide an improved method of manufacture and product ceramic superconductor having high density, high strength and high $J_c$ capacity.

It is an additional object of the invention to provide a novel method of manufacture of superconducting ceramics by use of variable oxygen partial pressure during sintering of the superconductor.

It is yet another object of the invention to provide an improved method of manufacture and product ceramic superconductor having a balance of good mechanical strength with small grain size, high density and high $J_c$ capacity.

It is still another object of the invention to provide a novel ceramic superconductor and method of manufacture to produce a substantially single phase ceramic superconductor sintered to high density while sustaining high $J_c$ capacity.

Other objects and advantages of the invention will become apparent from the Detailed Description and the drawings described hereinbelow and also from a copending application of the assignee of this application filed on the same day and incorporated by reference herein.

BRIEF DESCRIPTION OF THE DRAWINGS

FIG. 2 shows grain length distributions in $YBa_2Cu_3O_x$ wires sintered in flowing oxygen at 925° for 10 h (FIG. 2A); 935° C. for 12 h (FIG. 2B); 935° C. for 20 h (FIG. 2C) and 950° C. for 20 h (FIG. 2D);

FIG. 3 illustrates grain width distribution in $YBa_2Cu_3O_x$ wires sintered in flowing oxygen at 925° C. for 10 h (FIG. 3A); 935° C. for 12 h (FIG. 3B), 935° C. for 20 h (FIG. 3C) and 950° C. for 20 h (FIG. 3D);

DETAILED DESCRIPTION OF PREFERRED EMBODIMENTS

Figure 1A:
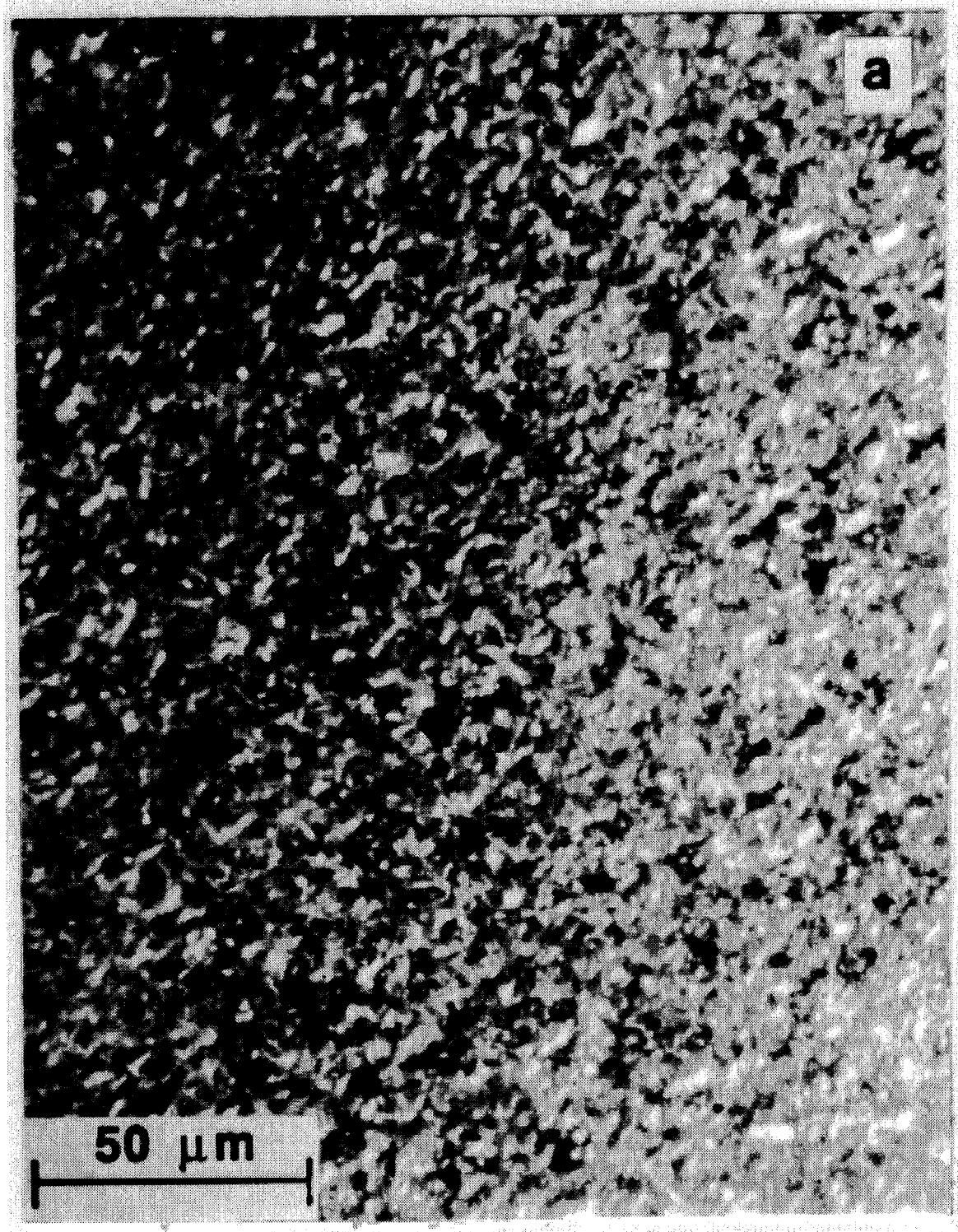
FIG. 1A illustrates an optical micrograph of $YBa_2Cu_3O_x$ specimens prepared by sintering in flowing oxygen at 910° C. for 10 h.
Figure 1B:
FIG. 1B shows an optical micrograph of $YBa_2Cu_3O_x$ sintered at 925° C. for 10 h.
Figure 1C:
FIG. 1C likewise shows $YBa_2Cu_3O_x$ sintered at 935° C. for 12 h
Figure 1D:
FIG. 1D shows $YBa_2Cu_3O_x$ sintered at 950° C. for 20 h.
Figure 4A:
FIG. 4 shows optical micrographs of a $YBa_2Cu_3O_x$ sintered at 910° C. for 10 h at $p(O_2)$ of 0.05MPa (FIG. 4A); 0.001 MPa (FIG. 4B); 0.0001 MPa (FIG. 4C) and 42 pa (FIG. 4D)
Figure 4B:
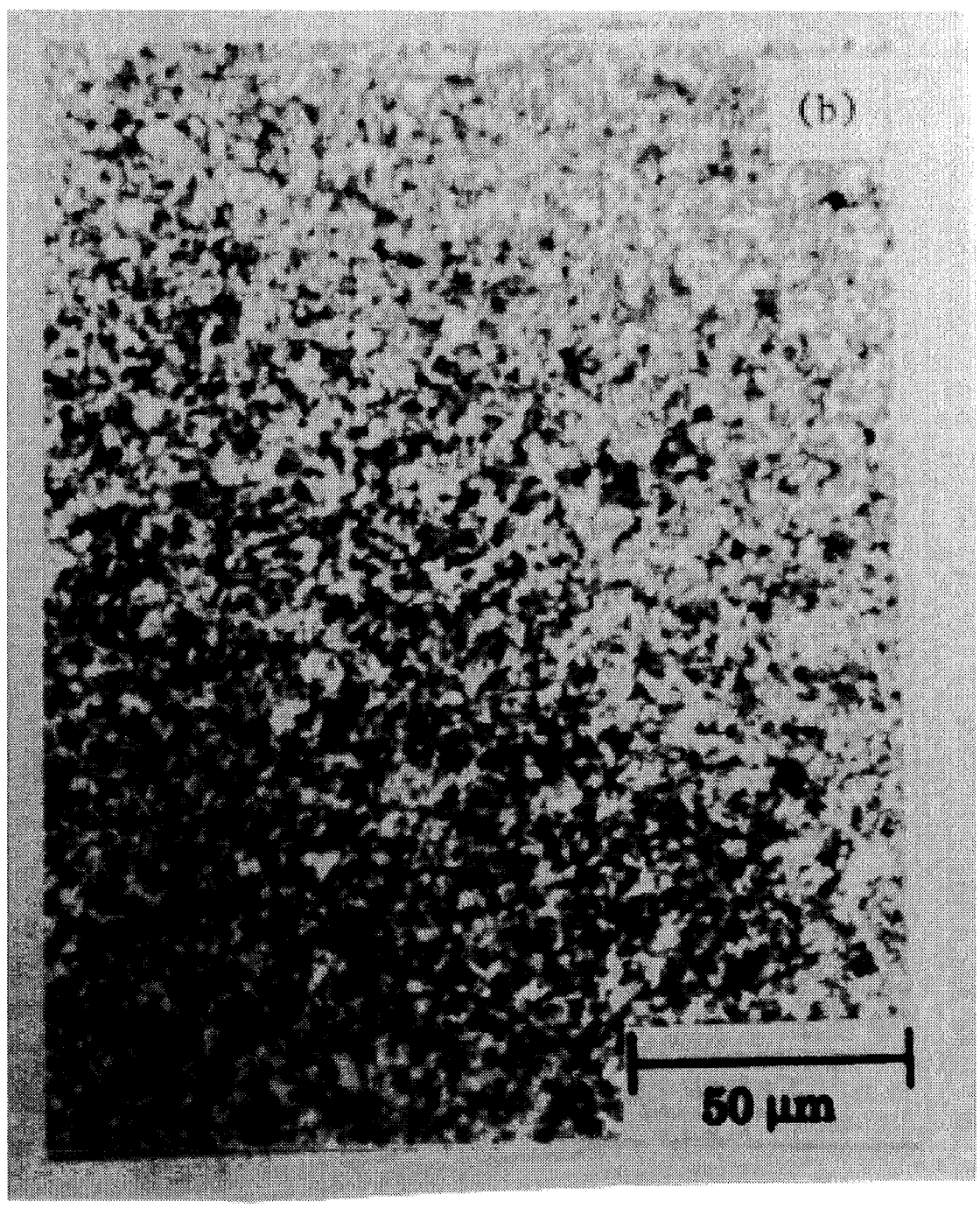
Figure 4C:
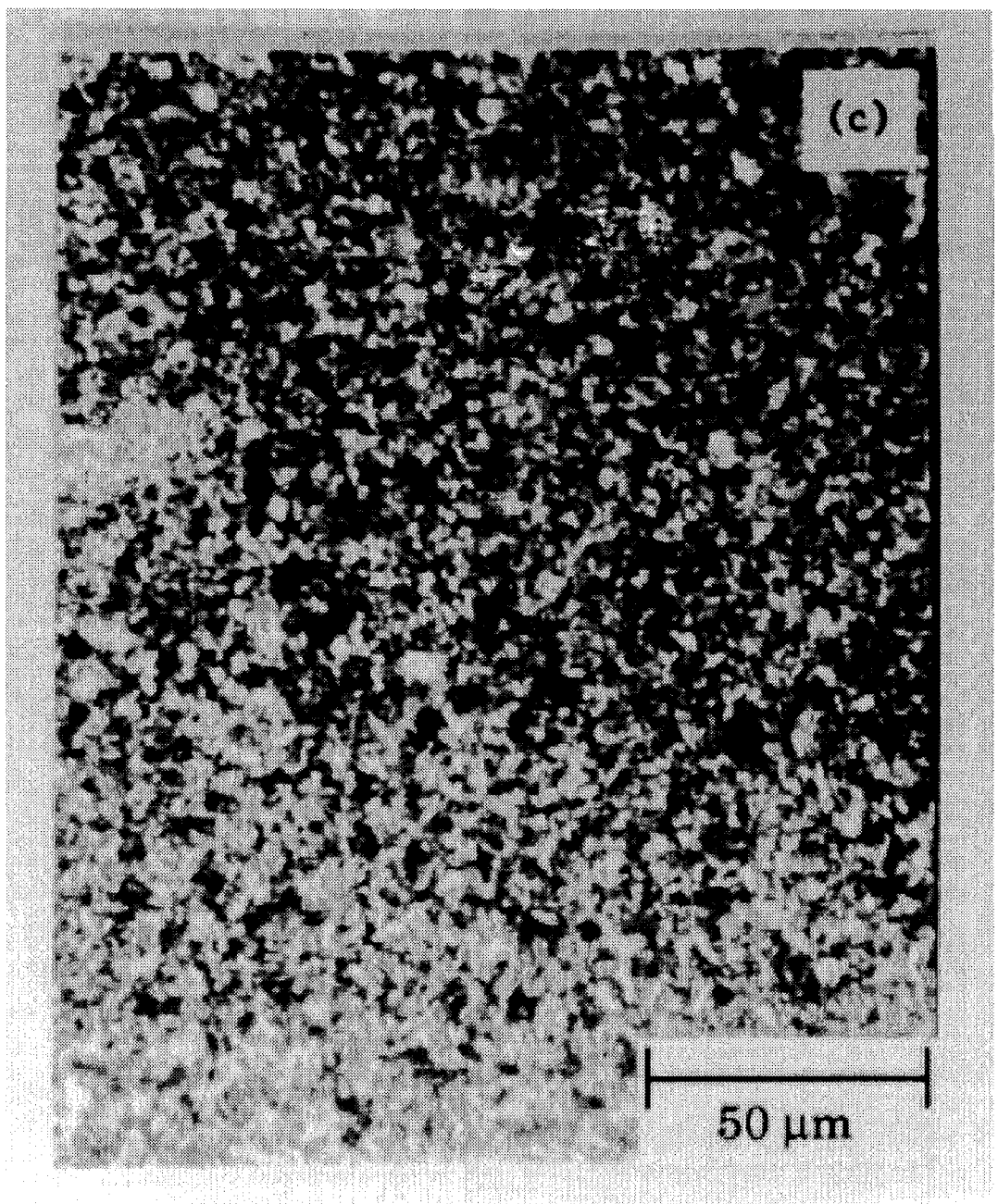
Figure 4D:
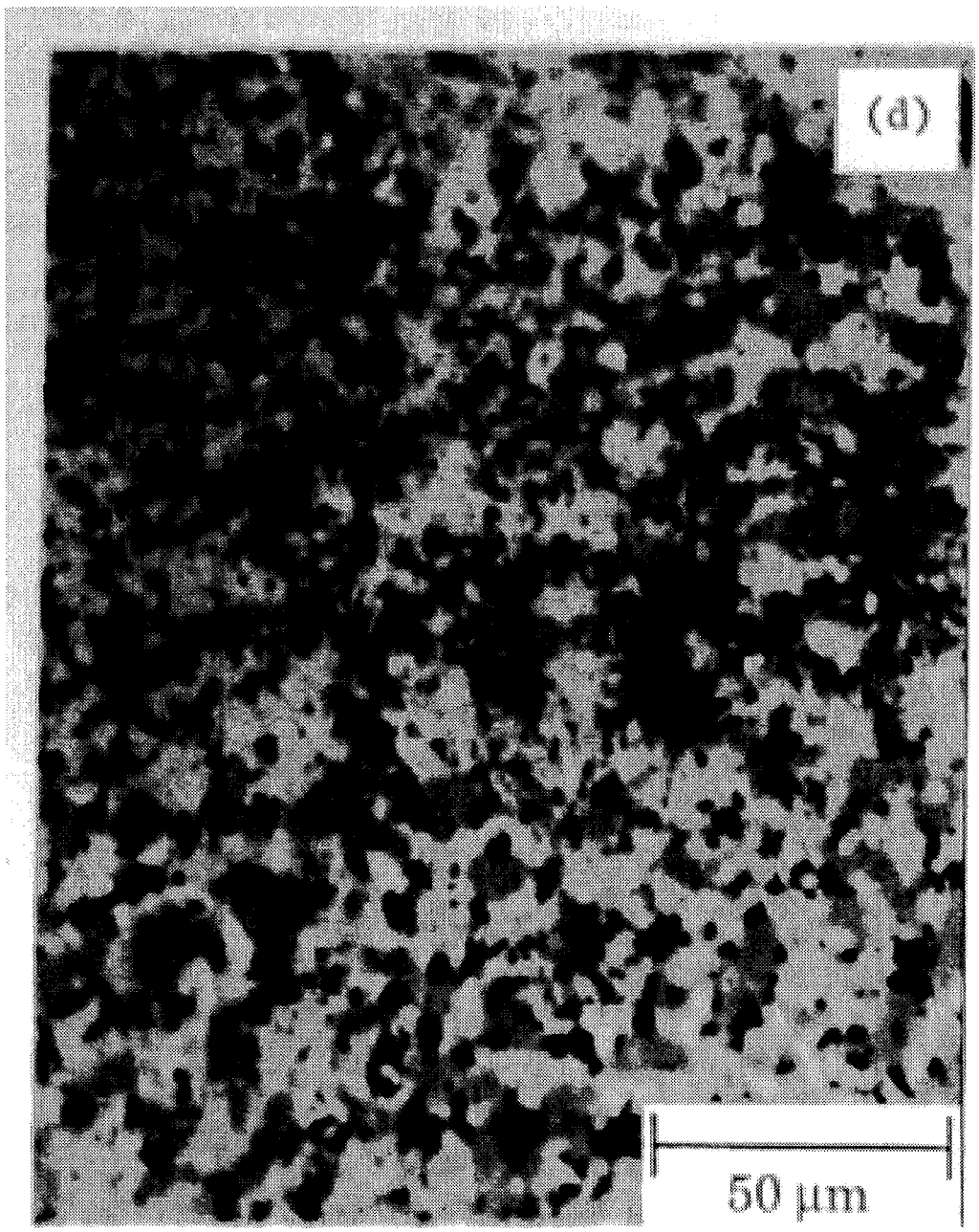

It is well understood and accepted that ceramic superconductors behave in substantially the same predictable manner as any multielement containing ceramic insofar as formation of the ceramic compound, kinetics of diffusion in the ceramic, and phase formation and phase conversion pursuant to acceptable phase diagrams. Mindful of the applicability of these basic concepts to all ceramic superconductors, the invention will be described for the preferred system of $YBa_2Cu_3O_x$ prepared in a form having high critical current capacity as well as good mechanical properties. $YBa_2Cu_3O_x$ powder can be synthesized, for example, by solid-state reaction of the constituent oxides $Y_2O_3$, CuO, and BaO. Powders of $Y_2O_3$, CuO, and $BaCO_3$ were mixed in appropriate proportions and were wet-ball-milled for approximately 12 h. The resulting slurry was dried in air and then vacuum-calcined in flowing oxygen at a reduced total pressure of ≅0.0003 MPa. The heating schedule included slowly heating in flowing oxygen at a reduced total pressure of ≅0.0003 MPa to 810° C. for 20 h and holding at this temperature for 8 h. Subsequently, the powder was cooled at 450° C. in a 100% flowing oxygen atmosphere in 10 h. The powder was held at 450° C. for 3 h and then slowly cooled to room temperature. This method results in the decomposition of $BaCO_3$ at lower temperatures (starting at 650° C. and completed at 800° C.) and eliminates formation of undesired impurity phases as indicated by conventional differential thermal analysis (DTA). No melting events associated with impurity phases were observed. The calcined powder was ground in a tungsten carbide rotary mill. The milled powder had an average particle size of ≅3 μm. Phase composition was confirmed as the expected phase pure form of $YBa_2Cu_3O_x$ by X-ray diffraction analysis.

The $YBa_2Cu_3O_x$ powder was mixed with appropriate solvent, dispersant, binder, and plasticizer to form a slip mixture for extrusion. The slip mixture was milled for ≅16 h in a plastic bottle containing $ZrO_2$ balls. Subsequently, the solvent in the slip was partially evaporated to obtain a plastic mass. The plastic mass was then forced through a die at high pressures to produce flexible wires of $YBa_2Cu_3O_x$. The wire was extruded in a continuous mode from which approximately 30 cm long pieces were cut and dried in air to achieve rigidity. These dried wires had a typical density of approximately 52% theoretical.

The extruded wires (after drying) were cut into approximately 3 cm long pieces and were sintered in a tube furnace at different temperatures (910°–950° C.) and various $p(O_2)$ levels (42 Pa–0.1 MPa). The wires were placed on a flat alumina tray which was subsequently introduced in the hot zone of the furnace. The $p(O_2)$ was controlled by using a mixture of oxygen and argon gases as the sintering environment in which the ratio of oxygen and argon was appropriately varied. Sintering was done in three stages: binder burnout, densification, and oxygen anneal. The initial binder burnout involved heating the specimens slowly to 240° C. and holding for 15 h to completely remove the organics, after which the temperature was raised to 910°–950° C. at a rate of 1° C./min. In the densification step, specimens were sintered at various temperatures for various lengths of time (10–20 h) and subsequently cooled to 450° C. at ≅1° C./min. Finally, the wires were annealed at 450° C. for 12 h in flowing oxygen at 0.1 MPa. The wires were then allowed to cool slowly in the furnace to room temperature, at which time the oxygen was turned off and the specimens removed. The sintered wires were reasonably straight, and the phase purity of the sintered wires was confirmed by X-ray analysis to be $YBa_2Cu_3O_x$.

Bulk density of the relatively dense (≥90% theoretical) sintered wires was measured by the Archimedes method while the apparent density of relatively porous (≤85% theoretical) specimens was measured by the geometrical method. Typically, four to six specimens were used for each set of preparation conditions. The microstructure was evaluated by both optical and electron microscopy. Grain microstructures were evaluated in polished longitudinal sections by polarized light in order to reveal grain sizes. The fracture surface of specimens was characterized by scanning electron microscopy. The specimens were composed of ≅3 cm long (≅1.14 mm or 45 mil diameter) wires and the strength was measured in an Instron mechanical testing machine in a three-point bending mode with a loading span of 1.825 cm and a crosshead speed of 0.127 cm/min. At least six specimens were tested for each set of conditions. The resistivity was measured by a conventional four-probe technique. Critical current density values were determined with a criterion of 1.0 μmV/cm at 77K and zero applied magnetic field. Typically four specimens were again tested for each condition. These results will be described hereinafter and presented in tabular form.

1. YBa2Cu3Ox sintered at $p(O_2)$=0.1 MPa.

The $YBa_2Cu_3O_x$ wires were sintered in flowing oxygen at a $p(O_2)$ of 0.1 MPa, and the wires had a range in density from ≅79 to 98% theoretical, as shown in Table I. The specimens (with density 24 90%) had primarily closed porosity, as indicated by the microstructure. These wires consisted of substantially pure $YBa_2Cu_3O_x$ phase, as indicated by X-ray diffraction. As expected, the density increased with increasing sintering temperature. Typical micrographs of the polished sections of specimens sintered in the temperature range of 910°–950° C. are shown in FIG. 1. The grains are clearly twinned as a result of internal strains from tetragonal-to-orthorhombic transformations.

The grains in FIG. 1 are generally elongated and have varying aspect ratios. Measured distributions of grain length and width are shown in FIGS. 2 and 3. Based on the grain-length distribution shown in FIG. 2, average grain length also increased with increasing sintering time and temperature. It can be seen in Table I that the largest grain length increases from 5 μm for specimens sintered at 910° C. for 10 h to 182 μm for specimens sintered at 935° C. for 20 h. A slight decrease in the largest grain size for the specimens sintered at 950° C. for 20 h is probably due to sample variations as well the difficulty in locating the absolutely largest grain size in a sample. Although grain length increased with increasing sintering temperature, the increase in grain length was minimal for specimens sintered at temperature above 935° C., due probably to large grains impinging on one another. On the other hand, grain width increased monotonically in the transverse direction. As indicated in Table I, grain width increased from 5 μm for specimens sintered at 310° C. for 10 h to 68 μm for specimens sintered at 950° C. for 20 h. The specimens sintered at 910° C. had a very low density of, 79% theoretical, and this resulted in reduced strength and $J_c$.

TABLE I

| Sintering temperature and time (°C.)/(h) | Density (% theoretical) | Average grain length (μm) | Average grain width (μm) | Maximum grain length (μm) | Maximum grain width (μm) |
|---|---|---|---|---|---|
| 910/10 | 79 ± 2.0 | ≅4.0 | ≅4.0 | 5 | 5 |
| 925/10 | 90 ± 2.5 | 6.0 | 2.0 | 20 | 6 |
| 935/12 | 96 ± 0.6 | 16.0 | 4.5 | 171 | 18 |
| 935/20 | 96 ± 1.7 | 16.5 | 4.5 | 182 | 26 |
| 950/20 | 98 ± 1.3 | 23.0 | 7.0 | 150 | 68 |

2. YBa2Cu3Ox specimens sintered at $p(O_2)$<0.1 MPa.

To obtain small grain microstructures, the specimens were sintered at relatively low temperatures. However, as discussed above, it was observed that sintering at lower temperatures (approximately 910° C.) and a $p(O_2)$ of 0.1 MPa resulted in the relatively low density of ≅79% theoretical. Such a low density is undesirable for both superconductivity and mechanical properties. Therefore, experiments were conducted to evaluate the effects of $p(O_2)$ on the sintering behavior of $YBa_2Cu_3O_x$ in order to establish a high density while maintaining a small-grain microstructure. The $YBa_2Cu_3O_x$ wire specimens were sintered at 910° C. for 10 h at different $p(O_2)$. The $p(O_2)$ was varied between about 0.1–0.000042 MPa. Table II shows the variation of measured density as a function of $p(O_2)$ for the specimens sintered at 910° C. for 10 h. Generally, density increased with decreasing p(O₂). It is believed that the increase in density with decrease in p($O_2$) is likely the result of enhanced sintering kinetics, due to increase in defect concentration and decrease in activation energy of the rate controlling species undergoing diffusion.

TABLE II

Dependence of density on p($O_2$) for $YBa_2Cu_3O_x$ specimens sintered at 910° C. for 10 h

| p($O_2$) (MPa) | Density (% theoretical) |
|---|---|
| 0.100000 | 79 ± 2.0 |
| 0.050000 | 85 ± 2.0 |
| 0.001000 | 91 ± 0.7 |
| 0.000100 | 94 ± 0.8 |
| 0.000042 | 83 ± 0.4 |

The microstructures for the specimens sintered at various p($O_2$) are shown in FIG. 4. These specimens have small grain microstructures, with the largest grains being ≅5 μm, which is equal to the particle size in the original powder. Although grain microstructures are similar for the specimens sintered at various p($O_2$), the specimens sintered at a very low p($O_2$) (42×10⁻⁶ MPa) had a relatively low density (83%) and show the presence of second-phase impurities (see FIG. 4). These phases are primarily $Y_2BaCuO_5$, $Cu_2O$, $BaCuO_2$, and $BaCO_3$, as detected by X-ray analysis (see FIG. 5). The low density and the presence of these second phases is the result of decomposition of $YBa_2Cu_3O_x$ at a low p($O_2$). At a given temperature, $YBa_2Cu_3O_x$ becomes thermodynamically unstable below a critical p($O_2$). The instant data indicates the critical value of p($O_2$) is ≅10⁻⁴ to 0.4×10⁻⁵ MPa at 910° C.

Figure 5:
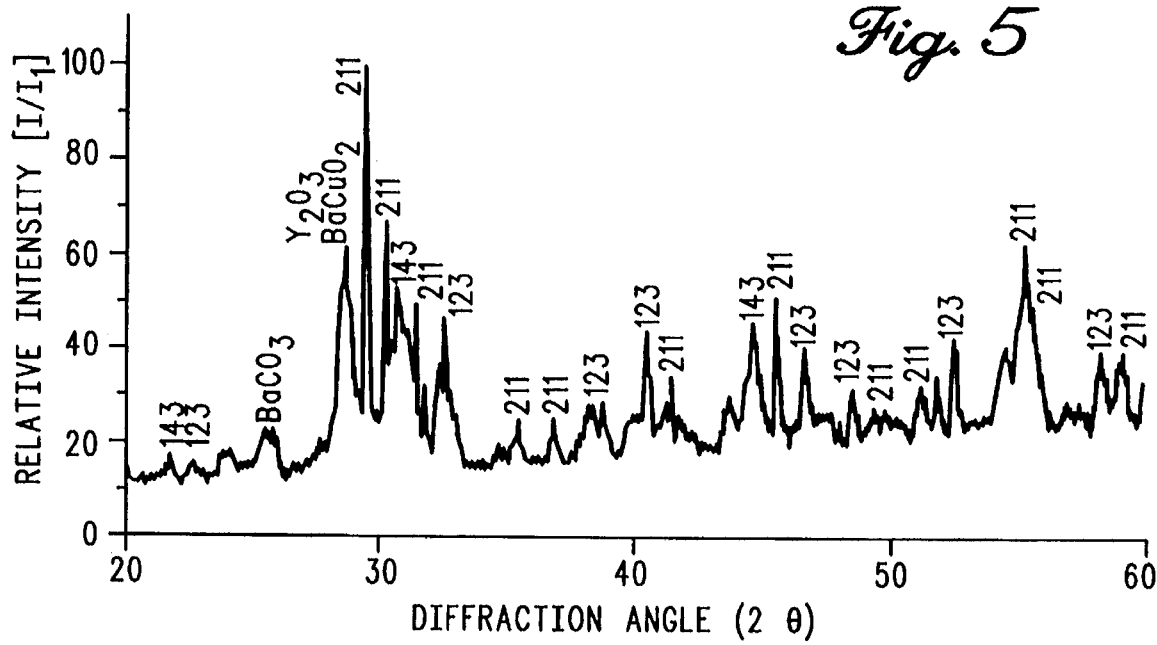
FIG. 5 illustrates X-ray diffraction peaks for $YBa_2Cu_3O_x$ specimens sintered at about 910° C. at $p(O_2)$=42 Pa.

The flexural strengths of specimens sintered at different temperatures and p($O_2$) are shown in Table III. A dependence of strength on grain size is plotted in FIG. 6. For the purpose of illustrating the effects of grain size, strength data for only the specimens with density ≧90% have been considered in FIG. 6. Specimens with low density ≦85% have open porosity, and the large effect of open porosity on strength degradation can mask the effect of grain size. For the specimens with density over 90% sintered at p($O_2$)≧0.001 MPa (shown by rectangles), the strength increases with decreasing grain size and reaches a maximum value of 191 MPa at an average grain size of ≅4 μm. As indicated by X-ray diffraction patterns, these specimens were phase-pure and did not show any noticeable impurity or second phases. In the preferred embodiment the sintering temperature is high enough to enable sintering to occur but without wetting of the ceramic superconductor compound. On the other hand, specimens sintered at 910° C./10 h and p($O_2$)=0.0001 MPa (shown by a triangle) had a relatively low strength in spite of having small grain size. As discussed in the previous section, at lower p($O_2$), $YBa_2Cu_3O_x$ becomes unstable and second phases begin to appear, as shown in FIGS. 4 and 5. We believe that p($O_2$)=0.0001 MPa represent a borderline region in which thermodynamic instability begins. Although at p($O_2$)=0.0001 MPa, the specimens do not show signs of bulk decomposition, a possibility of local decomposition could not be discarded. The local decomposition could have resulted in large critical flaws and observed low strength, in spite of small grain size.

TABLE III

Dependence of density, grain size, and strength on heat treatment.

| Sintering temperature and time (°C.)/(h) | p($O_2$) (MPa) | Density (% theoretical) | Average grain length (μm) | Fracture Strength (MPa) |
|---|---|---|---|---|
| 910/10 | 0.100000 | 79 ± 2.0 | ≅4.0 | 120 ± 10 |
| 925/10 | 0.100000 | 90 ± 2.5 | 6.0 | 141 ± 09 |
| 935/12 | 0.100000 | 96 ± 0.6 | 16.0 | 91 ± 07 |
| 935/20 | 0.100000 | 96 ± 1.7 | 16.5 | 95 ± 06 |
| 950/20 | 0.100000 | 98 ± 1.3 | 23.0 | 83 ± 05 |
| 910/10 | 0.050000 | 85 ± 2.0 | 3-5 | N/A |
| 910/10 | 0.001000 | 91 ± 0.7 | 3-5 | 191 ± 07 |
| 910/10 | 0.0001000 | 94 ± 0.8 | 3-5 | 72 ± 19 |
| 910/10 | 0.000042 | 83 ± 0.4 | 3-5 | 73 ± 38 |

The increase in strength with decrease in grain size (FIG. 6) is associated with a decrease in microcracking with decrease in grain size. Due to the grain anisotropy in $YBa_2Cu_3O_x$, large internal residual stresses ($\sigma_i$) are developed. FIG. 7 shows a micrograph of $YBa_2Cu_3O_x$ illustrating the propagation of an indentation crack. The crack propagates primarily along the grain boundaries, probably due to the presence of intergranular stresses due to grain anisotropy. It has been observed that these stresses can be partially or fully relieved by forming microcracks. The crack size (c) will be proportional to grain size, and it can be shown that microcracks will form if the grain sizes are larger than a critical value. Failure will initiate when the applied stress, $\sigma_a$, becomes equal to or greater than the strength, $\sigma_f$, of the material given by Griffith relation $\sigma_f = (2\gamma E/\pi c)^{1/2}$ (where γ is the fracture surface energy and E is the elastic modulus). Therefore, in the presence of an internal stress, $\sigma_i$, $$\sigma_a + \sigma_i = \sigma_f = (2\gamma E/\pi c)^{1/2}$$

Figure 6:
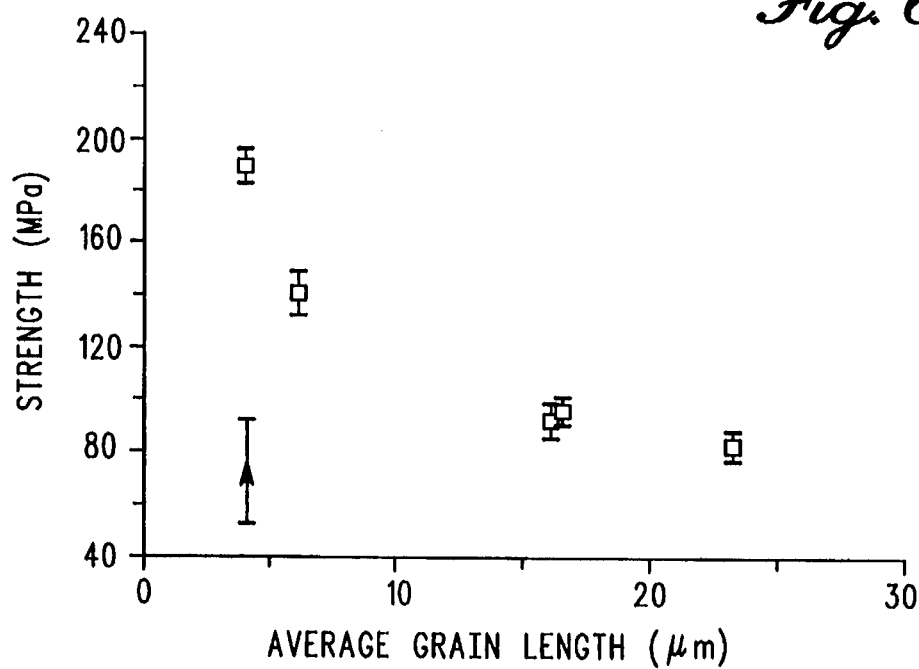
FIG. 6 shows the dependence of strength on grain size wherein rectangles represent specimens with over 90% density sintered at $p(O_2)$ greater than or equal to 0.001 MPa; triangles represent specimens with density over 90% interest at $p(O_2)$ equal to 0.0001 MPa.
Figure 7:
FIG. 7 is an optical micrograph of a $YBa_2Cu_3O_x$ specimen showing intergranular propagation of an indentation crack. The specimen was sintered at 950° C. for 10 h in flowing oxygen.

Because crack size, c, is proportional to grain size, d, $\sigma_a + \sigma_i = \sigma_f = (2\gamma E/\pi c)^{1/2}$ which is proportional to $(2\gamma E/\pi c)^{1/2}$ or $\sigma_a$ is proportional to $(1/\sqrt{d}) - \sigma_i$ The above equation concludes that applied failure stress is inversely proportional to the grain size, in accordance with the observed data shown in FIG. 6.

Figure 8:
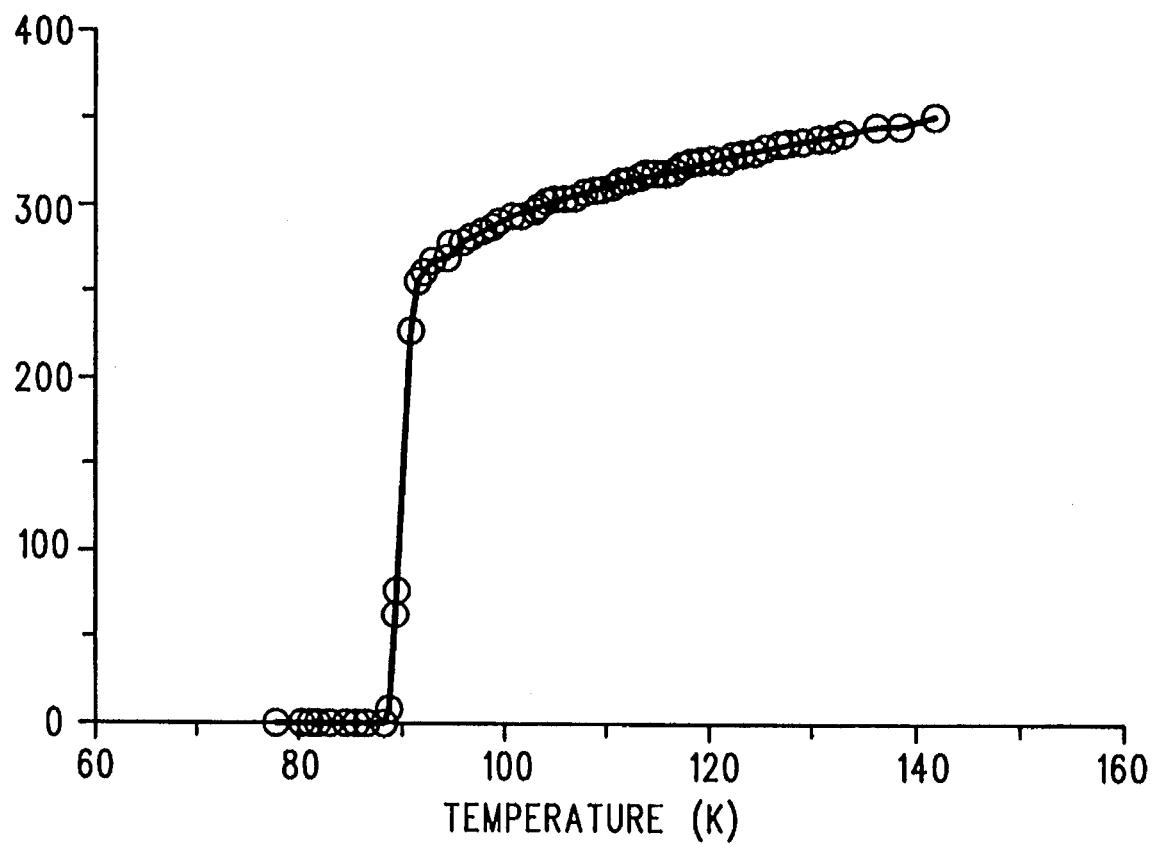
FIG. 8 shows the dependence of electrical resistivity on temperature for typical $YBa_2Cu_3O_x$ produced by the method of the invention.

The electrical properties, specifically $J_c$ and critical temperature ($T_c$), of the sintered wires were examined to determine the effects of heat treatments and grain size on $J_c$ and $T_c$. The onset of critical temperature was ≅91K. A typical resistivity plot showing resistivity as a function of temperature is shown in FIG. 8; the transition is sharp, with a typical width of ≅3K.

Table IV shows $J_c$ variation as a function of grain size. The $J_c$ data for specimens sintered at 925°–950° C. represent an average for four specimens in each case. The specimens sintered at 910° C. had a low density and only two specimens were evaluated for $J_c$. The standard deviation was generally less than 15%. It was noted that for dense specimens (density≧90% theoretical) sintered at a p($O_2$) of 0.1 MPa, the $J_c$ changed from 155Å/cm² for specimens with average grain size of 23 μm to 359Å/cm² for specimens with average grain size of 6 μm Although the absolute magnitude of $J_c$ may not have much significance, the result indicates a substantial relative decrease occurs in $J_c$ at large grain size. This observation has an important implication for microstructural development of good quality superconductor material.

While not limiting the scope of claim coverage, the reduced $J_c$ at large grain size can derive from the presence of microcracking. Due to grain anisotropy, internal stresses are developed which may result in microcracking in $YBa_2Cu_3O_x$ if the grains are not properly aligned. The reduced grain size decreases the occurrence of microcracking, while the increase in grain size results in increased microcracking and hence increased number of weak links. This will tend to decrease $J_c$ at increased grain sizes. On the other hand, increase in grain size decreases the number of grain boundaries which will tend to increase $J_c$. In the present study, the observed decrease in $J_c$ at large grain size is believed to be due to the predominant effect of increased weak links arising from increased microcracking.

High density ($\geq 90\%$ theoretical) $YBa_2Cu_3O_x$ specimens can be fabricated by sintering at relatively low temperature (~910° C.) in a low $p(O_2)$ (0.001 MPa). These specimens have small-grain microstructures, with an average grain size of 4 μm. The small-grain microstructure results in reduced microcracking, and hence strength as high as 191 MPa is achieved. Reduced microcracking can have important implications for developing microstructures with improved $J_c$.

TABLE IV

Variation of Jc with grain size for specimen sintered at 0.1 MPa

| Sintering temperature and time (°C.)/(h) | p(O₂) (MPa) | Density (% theoretical) | Average grain length (μm) | $J_c$ (A/cm²) |
|---|---|---|---|---|
| 910/10 | 0.1 | 79 ± 2.0 | 4.0 | 28 |
| 925/10 | 0.1 | 90 ± 2.5 | 6.0 | 359 |
| 935/20 | 0.1 | 96 ± 1.7 | 16.5 | 351 |
| 950/20 | 0.1 | 98 ± 1.3 | 23.0 | 155 |

The subject invention achieves a solution to a long standing problem of producing ceramic superconductors having good mechanical strength combined with high critical current density capacity. Control of $p(O_2)$ at particular low pressure values allows manufacture of fine grained ceramic without microcracking or excessive grain growth which have previously caused diminishment of $J_c$ and low mechanical strength. The resulting balanced microstructure gives rise to the excellent strength and high $J_c$ capacity.

Other advantages and features of the invention will become apparent from the claims set forth hereinafter with the scope of the claims determined by the embodiments described herein and by those reasonable equivalents as understood by those of ordinary skill in the art.

What is claimed is:

1. A method of manufacturing a ceramic superconductor article of manufacture by sintering a solid mass comprised of powders of the ceramic superconductor composed of a required stoichiometry to be superconducting, comprising the steps of:

providing a starting powder of said ceramic superconductor compound consisting essentially of $YBa_2Cu_3O_x$, with x being the amount required to achieve the superconducting phase;

forming a solid mass from said starting powder with said starting powder consisting essentially of $YBa_2Cu_3O_x$; and sintering said solid mass below the melting point of said compound of said ceramic superconductor, said step of sintering including applying to said solid mass a $p(O_2)$ of about 100 Pa to about 1000 Pa and a sintering temperature for achieving a product ceramic superconductor with a density for said solid mass of at least about 91% to about 95% of theoretical and said ceramic superconductor compound consisting essentially of $YBa_2Cu_3O_x$ and having a $J_c$ of at least about 155Å/cm².

2. The method as defined in claim 1 wherein said sintering step is performed under time and temperature conditions for achieving a grain size less than 16 μm average diameter.

3. The method as defined in claim 1 wherein the $J_c$ is at least about 300Å/cm².

4. The method as defined in claim 1 wherein said sintering temperature is high enough to enable sintering to occur but without wetting of said ceramic superconductor.

5. The method as defined in 4 wherein said sintering temperature is less than about 950° C. and more than about 850° C.

6. The method as defined in claim 4 wherein said sintering temperature is below said sintering temperatures at which microcracking occurs in said ceramic superconductor, 7. The method as defined in claim 1 wherein said step of preparing a starting powder comprises preparing a slip mixture of the compound of said ceramic superconductor.

8. The method as defined in claim 7 further including forging a solid mass body of said ceramic superconductor from said slip mixture.

9. The method as defined in claim 1 wherein a grain size of said product ceramic superconductor is from about 0.5 μm to about 15 μm.

10. The method as defined in claim 9 wherein the length of said grain size is less than about 15 μm.

11. The method as defined in claim 1 wherein a grain size of said product ceramic superconductor consists of a distribution having a peak size of about 3 μm to about 5 μm in width and less than about 10% of the grains having grain width in excess of 8 μm to 10 μm.

12. The method as defined in claim 11 wherein the length of said grain size is less than about 25–30 μm.

\* \* \* \* \*